(12) United States Patent
Eliashevich et al.

(10) Patent No.: US 6,661,167 B2
(45) Date of Patent: Dec. 9, 2003

(54) LED DEVICES

(75) Inventors: Ivan Eliashevich, Maplewood, NJ (US); Mathew L. Sommers, Sagamore Hills, OH (US); Stanton E. Weaver, Jr., Northville, NY (US)

(73) Assignee: GELcore LLC, Valley View, OH (US)

( * ) Notice: Subject to any disclaimer, the term of this patent is extended or adjusted under 35 U.S.C. 154(b) by 0 days.

(21) Appl. No.: 10/063,052

(22) Filed: Mar. 14, 2002

(65) Prior Publication Data

US 2002/0158578 A1 Oct. 31, 2002

Related U.S. Application Data

(60) Provisional application No. 60/275,774, filed on Mar. 14, 2001.

(51) Int. Cl.[7] .................................................. F21V 5/00
(52) U.S. Cl. ....................................... 313/512; 362/329
(58) Field of Search ................................. 362/800, 326, 362/329; 313/498, 499, 512

(56) References Cited

U.S. PATENT DOCUMENTS 5,865,529 A * 2/1999 Yan ............................. 362/327

\* cited by examiner

*Primary Examiner*—David Vu
(74) *Attorney, Agent, or Firm*—Fay, Sharpe, Fagan, Minnich & McKee, LLP

(57) ABSTRACT

A light emitting diode (LED) device (A) and processes for its manufacture are provided. The LED device (A) includes a light emitting chip or die (10) and an encapsulant (22) surrounding the same. The encapsulant (22) is substantially spherical in shape, and the die (10) is preferably located at a substantial center of the encapsulant (22). An electrically conductive path extends from the chip or die (10) to a periphery of the encapsulant (22) such that the chip/die (10) can be selectively energized to produce light by applying electricity to the electrically conductive path at the periphery of the encapsulant (22). Preferably, the encapsulant (22) is chosen to have an index of refraction as close as possible to the higher of an index of refraction of the die's semiconductor material and an index of refraction of the die's substrate (12).

23 Claims, 8 Drawing Sheets

LED DEVICES

CROSS REFERENCE TO RELATED APPLICATIONS

The present application claims the benefit of U.S. Provisional Application No. 60/275,774, filed Mar. 14, 2001, which is incorporated herein by reference in its entirety.

BACKGROUND OF INVENTION

The present invention relates to optoelectronic devices such as light emitting diode (LED) devices.

Light emitting diode chips or "LED chips" include thin layers of semiconductor material of two opposite conductivity types, referred to as p-type and n-type. The layers are disposed in a stack, one above the other, with one or more layers of n-type material in one part of the stack and one or more layers of p-type material in the other part of the stack. For example, the various layers may be deposited in sequence on a substrate to form a wafer. The wafer is then cut apart to form individual dies or chips which constitute separate LEDs. The junction between the p-type and n-type material may include directly abutting p-type and n-type layers, or may include one or more intermediate layers which may be of any conductivity type or which may have no distinct conductivity type. In operation, electric current passing through the diode is carried principally by electrons in the n-type layers and by electron vacancies or "holes" in the p-type layers. The electrons and holes move in opposite directions toward the junction and recombine with one another at the junction. Energy released by electron-hole recombination is emitted as light. As used in this disclosure, the term "light" includes radiation in the infrared and ultraviolet wavelength ranges, as well as radiation in the visible range. The wavelength of the light depends on factors including the composition of the semiconductor materials and the structure of the junction.

Commonly, electrodes are connected to the n-type and p-type layers near the top and bottom of the stack. The materials in the electrodes are selected to provide low-resistance interfaces with the semiconductor materials. The electrodes, in turn, are provided with pads suitable for connection to wires or other conductors which carry current from external sources. The pad associated with each electrode may be a part of the electrode, having the same composition and thickness of the electrode, or may be a distinct structure which differs in thickness, composition, or both from the electrode itself.

Some LED chips have electrodes on the bottom surface of the bottom semiconductor layer. For example, the various layers may be deposited in sequence on an electrically conductive substrate, and the substrate may be left in place on the bottom surface to act as a bottom electrode. However, LED chips formed from certain semiconductor materials normally use nonconductive substrates to promote proper formation of the semiconductor layers. The nonconductive substrate typically is left in place, so that an electrode cannot be readily provided on the bottom surface of the bottom layer. For example, gallium nitride-based materials such as GaN, AlGaN, InGaN and AlInGaN are used to form LED chips emitting light in various wavelength ranges including blue and ultraviolet. These materials typically are grown on insulating substrates such as sapphire or alumina.

LED chips incorporating an insulating substrate often include a bottom electrode at a location on the stack above the substrate but below the junction. Typically, the upper layer or layers of the stack are removed after formation of the stack in a region covering part of the area of each die, so as to provide an upwardly-facing lower electrode surface on a layer at or near the bottom of the stack in each die. This leaves a region referred to as a "mesa" projecting upwardly from the lower electrode surface and covering the remaining area of the die. The area of the die occupied by the lower electrode surface typically does not emit light. It is desirable to keep the horizontal extent of this inactive area as small as possible.

The LED chip and a pair of electrical contacts are typically packaged in a material that is transparent to the light emitted from the LED chip to provide an LED device, allowing light to emerge from the package. The packaging material is typically a thermoset material, such as epoxy or thermoplastic material. The materials that are customarily used for LED packaging usually have a refractive index that is lower than the LED chip and the substrate material. The lower refractive index of the packaging material relative to the LED chip reduces the amount of light emitted out of the LED device because of the relatively high critical angle loss of the light emitted from the LED chip. The critical angle loss is caused by the total internal reflection of light incident to the LED chip surfaces at angles greater than the critical angle. The critical angle refers to the angle of incidence of light at the LED surface of the LED chip for which the refraction angle of the light at the package surface is 90° to the normal. When the critical angle is greater, more light can escape the LED chip into the package. Using a packaging material that has a lower refractive index than the LED chip material decreases the critical angle and reduces the light that can escape from the LED chip.

Attempts have been made to package LED chips in materials having higher refractive indices than the customarily used epoxy and plastic materials to improve the light extraction from LED devices. Additionally, chips have been packaged in reflector cups and encapsulated with package material to improve light extraction from the LED chip by reflecting light from the underside of the LED chip mounted on the reflector cup. Despite these attempts, heretofore there still existed a desire to improve light extraction from LED chips.

The present invention contemplates a new and improved LED device and process for manufacturing and/or using the same which overcomes the above-referenced problems and others.

SUMMARY OF INVENTION

In accordance with an aspect of the present invention, a light emitting diode device includes a light emitting diode chip and an encapsulant surrounding the light emitting diode chip. The encapsulant is substantially spherical in shape, and an electrically conductive path extends from the light emitting diode chip to a periphery of the encapsulant such that the light emitting diode chip is selectively energized to produce light by applying electricity to the electrically conductive path at the periphery of the encapsulant.

In accordance with another aspect of the present invention, a method of manufacturing a light emitting diode device is provided. The method includes providing a light emitting diode chip and surrounding the light emitting diode chip with a substantially spherical encapsulant. Further, an electrically conductive path is provided extending from the light emitting diode chip to a periphery of the encapsulant such that the light emitting diode chip is selectively energized to produce light by applying electricity to the electrically conductive path at the periphery of the encapsulant.

In accordance with yet another aspect of the present invention, a method of producing light includes providing a light emitting diode chip and surrounding the light emitting diode chip with a substantially spherical encapsulant. The method further includes providing an electrically conductive path extending from the light emitting diode chip to a periphery of the encapsulant and applying electricity to the electrically conductive path at the periphery of the encapsulant such that the light emitting diode chip is energized to produce light.

One advantage of the present invention is enhanced light extraction from an LED device as compared to similar LED devices with other packaging and/or encapsulation designs.

Another advantage of the present invention is ease and flexibility of manufacturing.

Yet another advantage of the present invention is the ability to accurately determine k factor and/or readily model LED chip characteristics such as view angle.

Still further advantages and benefits of the present invention will become apparent to those of ordinary skill in the art upon reading and understanding the following detailed description of the preferred embodiments.

BRIEF DESCRIPTION OF DRAWINGS

The invention may take form in various components and arrangements of components, and in various steps and arrangements of steps. The drawings are only for purposes of illustrating a preferred embodiment(s) and are not to be construed as limiting the invention. Further, it is be appreciated that the drawings are not to scale.

DETAILED DESCRIPTION

Figure 1:
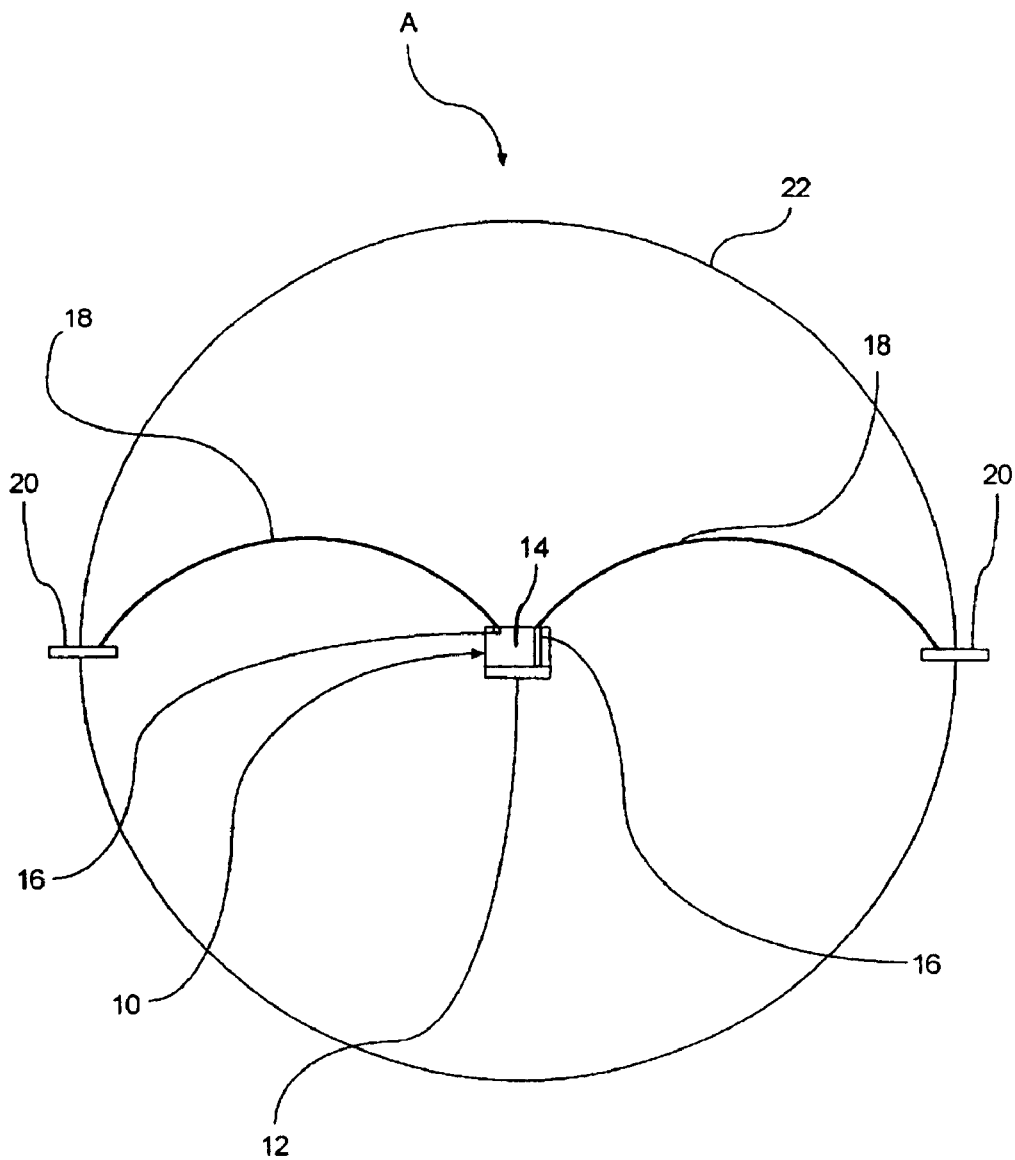
FIG. 1 is a diagrammatic illustration of an exemplary LED device in accordance with aspects of the present invention.

With reference to FIG. 1, an LED device A includes an LED chip or die 10 having a substrate 12 upon which a stack 14 of semiconductor and/or other LED forming materials are layered. The die 10 may be any type of conventional LED die known in the art. Preferably, the die 10 is a gallium nitride-based LED, e.g., a gallium nitride (GaN) LED, an aluminum gallium nitride (AlGaN) LED, an indium gallium nitride (InGaN) LED, an aluminum indium gallium nitride (AlInGaN) LED, or the like. Preferably, the substrate 12 is a sapphire, alumina, or other appropriate substrate material as is known in the art, be it transparent, opaque, reflective or otherwise. Additionally, the substrate 12 may be electrically conductive or electrically insulating. In one alternate embodiment, the die's substrate 12 is removed or omitted altogether.

In any event, the die 10 includes a pair of electrodes 16 which operatively connect the die 10 to electrically conductive pads 20 via electrically conductive wire bonds 18 therebetween. Accordingly, the die 10 may be selectively energized to produce light by selectively applying electricity to the pads 20. Optionally, when an electrically conductive substrate 12 is employed, the substrate 12 may act as one of the electrodes 16 or otherwise have one of the electrodes 16 connected thereto. The produced light may be of any desired wavelength or wavelengths depending upon the type of LED die 10 employed. Preferably, the light is in the blue to ultraviolet wavelength range. In any event, the substrate 12 and encapsulant 22 (described below) are both preferably transparent or substantially optically transmissive with respect to the wavelength of light produced by the die 10.

The die 10 is encapsulated in a substantially spherical encapsulant 22. Preferably, the die 10 is substantially centered in the encapsulant 22 and the wire bonds 18 extend from the die's electrodes 16 through the encapsulant 22 to the pads 20 which are arranged at a periphery of the encapsulant 22. The encapsulant 22 is preferably an epoxy, plastic, low temperature glass, polymer, thermoplastic, thermoset material, resin or other type of LED encapsulating material as is known in the art. Optionally, the encapsulant 22 is a spin-on glass or some other high index of refraction material. Also, a phosphor is optionally dispersed in and/or coated on the encapsulant 22. Depending on the type employed, the phosphor emits light of a desired wavelength when excited, e.g., with light produced by the LED die 10. In this manner, the LED device A can be made to emit light of a desired wavelength or wavelengths even though the die 10 employed produces light of another wavelength or wavelengths. Preferably, the LED device A is made to emit a spectrum of light which is white or nearly white.

Figure 2:
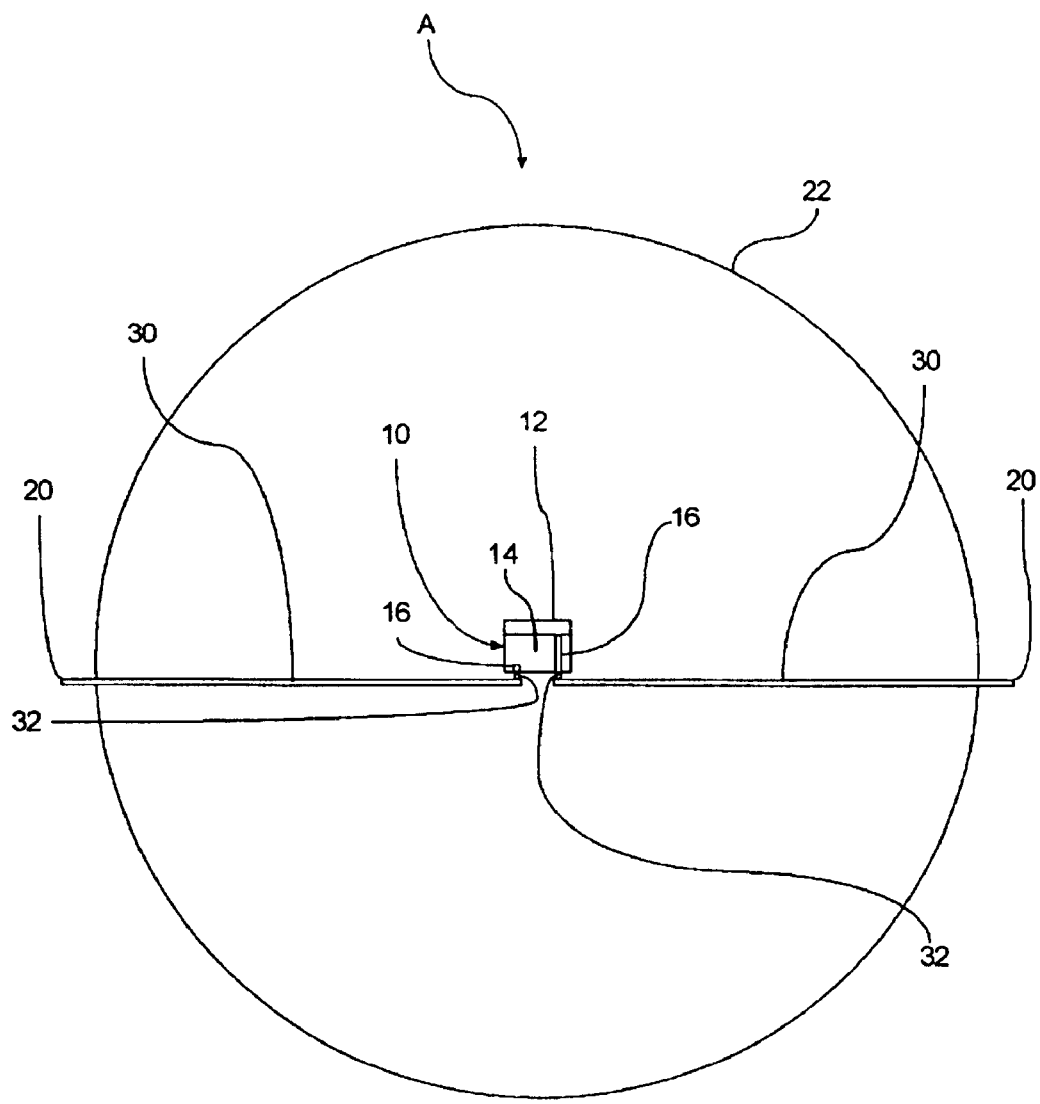
FIG. 2 is a diagrammatic illustration of another exemplary LED device in accordance with aspects of the present invention.

With reference to FIG. 2, wherein common reference numbers refer to like parts or elements, an alternate exemplary embodiment of the LED device A is shown. In this embodiment, an electrically conductive lead-frame 30 replaces or otherwise acts as a substitute for the wire bonds 18. The electrically conductive lead-frame 30, preferably metal, is connected to the pads 20. The die 10 is flip-chip bonded to the lead-frame 30 such that the die's electrodes 16 make electrical contact with solder bumps 32 extending from the lead frame 30. Optionally, the lead-frame 30 and pads 20 are one integral part or element, or alternately, they are separate parts or elements which are electrically connected to one another. In either case, an electrically conductive path extends through the encapsulant 22 between the pads 20 and the die 10. Accordingly, the die 10 may still be selectively energized to produce light by selectively applying electricity to the pads 20.

Figure 3:
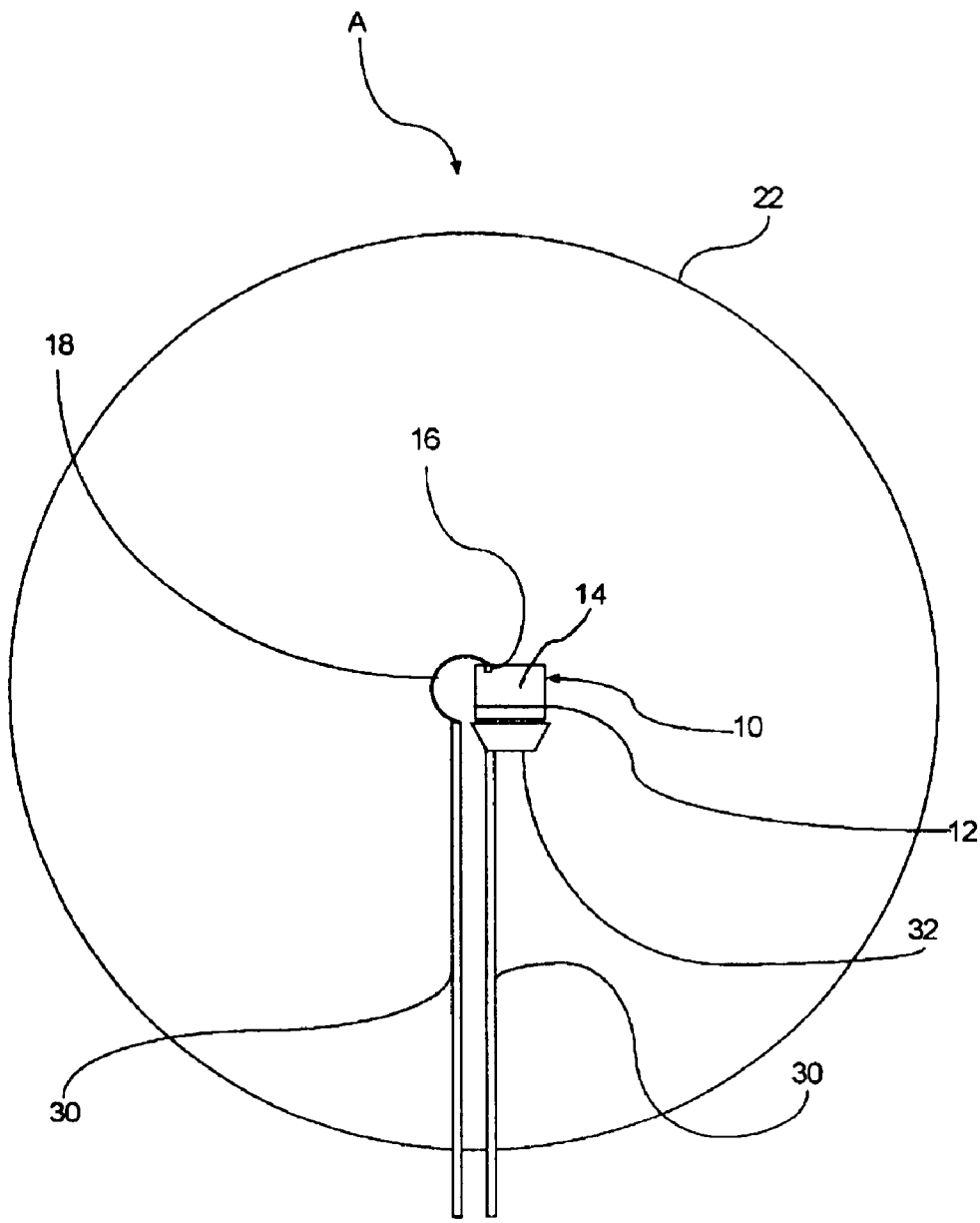
FIG. 3 is a diagrammatic illustration of yet another exemplary LED device in accordance with aspects of the present invention.

With reference to FIG. 3, wherein common reference numbers again refer to like parts or elements, another alternate exemplary embodiment of the LED device A is shown. In this embodiment, the die 10 is bonded to a die-receiving area 32 on a first lead of an electrically conductive lead-frame 30 such that a first electrode of the die 10 is in electrical contact therewith. Preferably, in this embodiment, the substrate 12 is electrically conductive and acts as the first electrode. A wire bond 18 is connected between the die's second electrode 16 and a second lead of the lead-frame 30. The leads of the electrically conductive lead-frame 30, preferably metal, extend out of the encapsulant 22. Again, an electrically conductive path extends through the encapsulant 22 to the die 10 such that the die 10 may be selectively energized to produce light by selectively applying electricity to the leads of the lead-frame 30.

Figure 4:
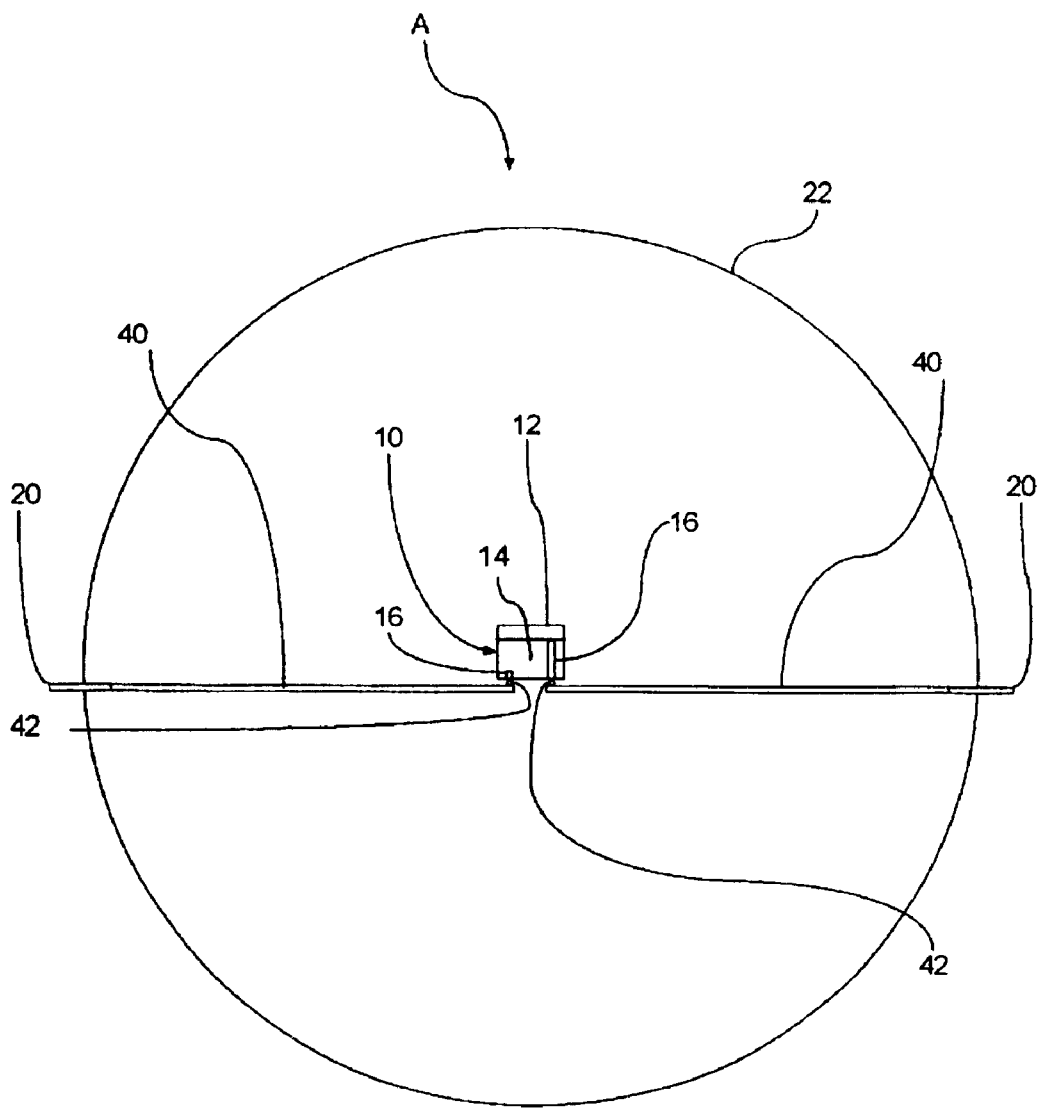
FIG. 4 is a diagrammatic illustration of yet another exemplary LED device in accordance with aspects of the present invention.

With reference to FIG. 4, wherein common reference numbers again refer to like parts or elements, yet another alternate exemplary embodiment of the LED device A is shown. In this embodiment, a conductor 40 extends through the encapsulant and is used to connect the die 10 to the pads 20. The conductor 40 is preferably made of a substantially optically transparent electrically conductive material such as one selected from a family of conductive transparent metal oxides and doped transparent metal oxides, including but not limited to indium, indium tin, cadmium, tin, gallium, and zinc, or another appropriate substantially optically transparent electrically conductive material. An electrically conductive adhesive 42 preferably joins the die 10 to the electrical conductor 40 and ensures electrical contact between the electrodes 16 and the conductor 40. Preferably, the die 10 is flip-chip bonded to the conductor 40. Again, an electrically conductive path extends through the encapsulant 22 to the die 10 such that the die 10 may be selectively energized to produce light by selectively applying electricity to the pads 20. Additionally, the at least partial transparency of the electrically conductive path reduces its interference with light extraction from the LED device A.

Preferably, the encapsulant 22 is made from a material having a index of refraction, $n_2$, which is the same as or substantially similar to an index of refraction, $n_1$, corresponding to the material from which the die 10 is constructed. More preferably, $|n_1-n_2| \leq 0.1$. Most preferably, $n_1=n_2$. When an at least partially transparent substrate 12 is employed having an index of refraction of $n_3$, preferably, $n_2$ is chosen to be substantially the same as the higher of $n_1$ and $n_3$. Alternately, $n_2$ is made as close as possible to the higher of $n_1$ and $n_3$.

It is to be appreciated that the relative indices of refraction and the size and shape of the encapsulant 22 are designed and/or chosen to maximize the extraction of light from the LED device A by minimizing or eliminating total internal reflection (TIR) at the die-encapsulant interface, the substrate-encapsulant interface (when an at least partially transparent substrate is employed) and the encapsulant-air interface. The critical angle for TIR at the die-encapsulant interface is given by equation (1):

$$\alpha_{die\text{-}encapsulant} = \sin^{-1}\frac{n_2}{n_1}, \quad (1)$$

where $\alpha_{die\text{-}encapsulant}$ is the critical angle, $n_2$ is the index of refraction of the encapsulant material, and $n_1$ is the index of refraction of the die material. Similarly, the critical angle for TIR at the substrate-encapsulant interface is given by equation (2):

$$\alpha_{substrate\text{-}encapsulant} = \sin^{-1}\frac{n_2}{n_3}, \quad (2)$$

where $\alpha_{substrate\text{-}encapsulant}$ is the critical angle, $n_2$ is the index of refraction of the encapsulant material, and $n_3$ is the index of refraction of the die material. Finally, the critical angle for TIR at the die-encapsulant interface is given by equation (3):

$$\alpha_{encapsulant\text{-}air} = \sin^{-1}\frac{n_{air}}{n_2}, \quad (3)$$

where $\alpha_{encapsulant\text{-}air}$ is the critical angle, $n_2$ is the index of refraction of the encapsulant material, and $n_{air}$ is the index of refraction of air, which is 1. Accordingly, the light extraction from the LED device A is maximized by making the respective elements out of materials with appropriate relative indices of refraction.

By maximizing $\alpha_{die\text{-}encapsulant}$, the greatest amount of light will be transmitted across the die-encapsulant interface. That is to say, light having a larger range of angles of incident will pass through the interface insomuch as the critical angle is larger. Similarly, by maximizing $\alpha_{substrate\text{-}encapsulant}$, the greatest amount of light will be transmitted across the substrate-encapsulant interface. Accordingly, the indices of refraction $n_1$, $n_2$ and $n_3$ are preferably chosen so that $n_2$ substantially matches the higher of $n_1$ and $n_3$ as closely as possible. The indices of refraction are preferably chosen in this manner because: (i) TIR is only a problem when light is traveling from a higher refractive index material to a lower refractive index material, therefore by striving to matching the index of refraction of the encapsulant 22 with the higher of the indices of refraction of the die and substrate materials, the index of refraction of the encapsulant 22 may be higher than the lower of the two indices so that light traveling from lower index material (be it the die material or substrate material) will not be subject to TIR, (ii) the critical angle at the other interface is maximized when the indices on either side of the interface are as close as possible, and (iii) choosing $n_2$ arbitrarily high unduly exaggerates the difference in indices of refraction at the encapsulant-air interface insomuch as the air side index of refraction is essentially a fixed parameter, and to the extent the difference in indices of refraction at the encapsulant-air interface is enlarged, $\alpha_{encapsulant\text{-}air}$ is made undesirably smaller. Therefore, it is preferred that the $n_2$ be larger than the lower of $n_1$ and $n_3$ so that TIR is not a problem at that interface. It is also preferred that $n_2$ substantially matches the other of $n_1$ and $n_3$ as close as possible so that the corresponding critical angle at that interface is maximized. It is further preferred that $n_2$ not be arbitrarily large thereby unduly reducing the critical angle at the encapsulant-air interface.

For example, consider a die 10 comprising a GaN LED with a sapphire substrate 12. The GaN has an index of refraction of approximately 2.3, i.e., $n_1=2.3$, and the sapphire has an index of refraction of approximately 1.7, i.e., $n_3=1.7$. Therefore, the material for the encapsulant 22 is preferably chosen to have an index of refraction as close to 2.3 as possible. Accordingly, assuming an appropriate 2.3 index of refraction encapsulant material is employed, at the sapphire-encapsulant interface, the light is traveling from a lower index of refraction ($n_3=1.7$) to a higher index of refraction ($n_2=2.3$) and TIR is not a problem. Furthermore, the critical angle at the GaN-encapsulant interface is maximized, i.e., $\alpha_{GaN\text{-}encapsulant}=\sin^{-1}(2.3/2.3)=90°$, without the critical angle at the encapsulant-air interface being unduly reduced, i.e., $\alpha_{encapsulant\text{-}air}=\sin^{-1}(1/2.3)=25.8°$. Of course, the materials suggested and values of the indices of refraction used in this example are merely illustrative and not intended to be taken literally and are not intended to be limiting.

In addition, the spherical shape of the encapsulant 22 allows light to be extracted from the LED device A in all directions. That is to say, regardless of the direction of the light emitted by the die 10, the emitted light is still headed in a direction which leads out of the LED device A. Further, by appropriately sizing the diameter of the substantially spherical encapsulant 22, it can be made so that light emitted from the substantially centered die 10 has a near normal angle of incidence at the encapsulant-air interface. In this manner, TIR at the encapsulant-air interface is minimized even when $\alpha_{encapsulant-air}$ is small. The diameter of the substantially spherical encapsulant 22 is preferably in the range of 7 to 12 millimeters (mm) for smaller chips, 10 to 25 mm for larger chips, and 20 to 40 mm for multi-die chip arrays. More preferably, the diameter is greater than approximately 10 times the object size, i.e., the largest dimension of the die 10, and most preferably, the diameter is greater than approximately 20 times the object size.

In a preferred embodiment, the LED device A is used to determine what is known as k factor. The k factor is a measure of the increased optical power output from the die 10 when an encapsulant is put around the die 10 as compared to when no encapsulant surrounds the die 10. By using the LED device A to determine the k factor, interference from packaging geometry and other device elements and TIR can be minimized thereby providing a more accurate k factor determination. Similarly, the die characteristics such as view angle output can more readily be observed with limited packaging distortions. That is to say, using goniometric measurements and/or the like, the die 10 can be observed and an accurate model thereof with limited packaging distortions can be produced from the observations, as opposed to using time and computationally expensive software modeling which entails a detailed structural description of the die 10 and packaging elements to be entered.

Figure 5A:
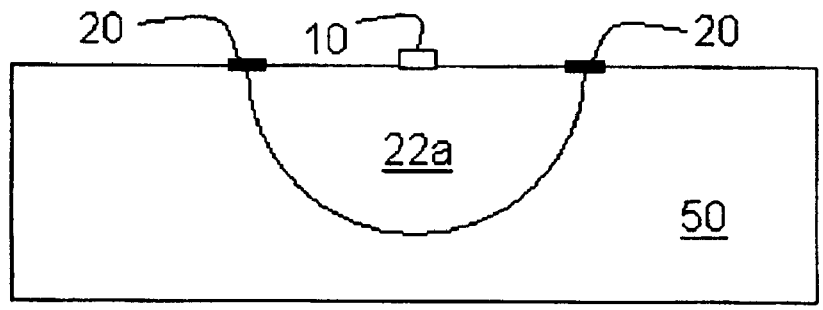
FIGS. 5A through 5C illustrate an exemplary process of manufacturing LED devices in accordance with aspects of the present invention.
Figure 5B:
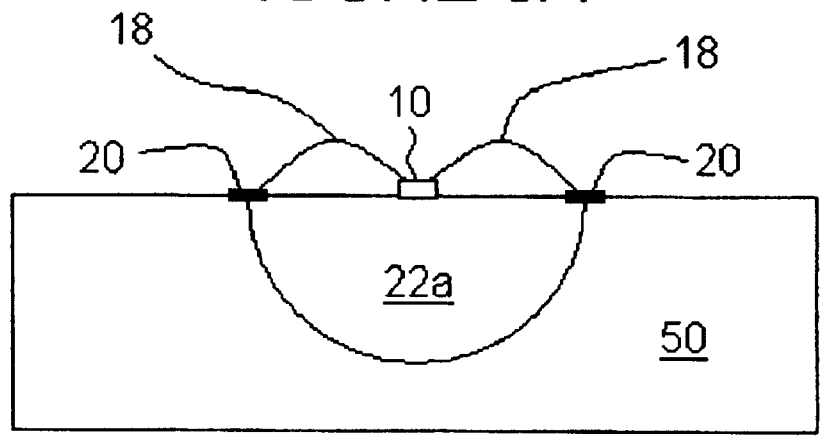
Figure 5C:
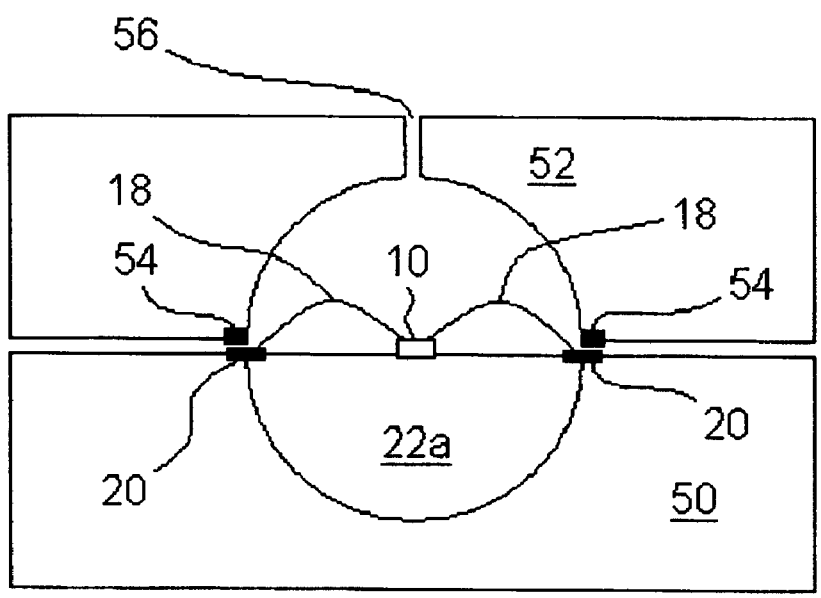

With reference to FIGS. 5A through 5C, an exemplary process for manufacturing the LED device A of FIG. 1 is shown. A first hemispherical mold 50 is filled with the encapsulant material 22a. The pads 20 are held by the mold 50 at the periphery of the hemisphere, or are otherwise placed there either before or after the encapsulant material 22a is deposited in the mold 50. After the encapsulant material 22a is deposited in the mold 50, the die 10 is placed centrally on top thereof as shown in FIG. 5A. Preferably, the die 10 is placed on the deposited encapsulant material 22a before the encapsulant material 22a has fully cured to thereby form an optically smooth interface therebetween.

Preferably after the encapsulant material 22a has cured, the wire bonds 18 are connected from the die's electrodes 16 to the pads 20. See FIG. 5B. Thereafter, as shown in FIG. 5C, a second hemispherical mold 52 is positioned and secured over the first hemispherical mold 50 such that they define a substantially spherical cavity, albeit half filled with the encapsulant material 22a. Preferably, a rubber o-ring 54 or the like is arranged between the molds 50 and 52 at least partially covering the pads 20. The o-ring 54 promotes a good seal between the molds 50 and 52 and protects the pads 20 from being completely molded over with the encapsulant material 22a.

The mold 52 includes a port 56 through which additional encapsulant material 22a is injected to fill the remainder of the cavity defined by the molds 50 and 52. Optionally, a vent (not shown) is also provided in the mold 52 to thereby allow air and/or other gases to escape as the remainder of the cavity is being filled with the encapsulant material 22a. Once the added encapsulant material 22a has cured, the resulting LED device A of FIG. 1 may be unmolded.

Figure 6A:
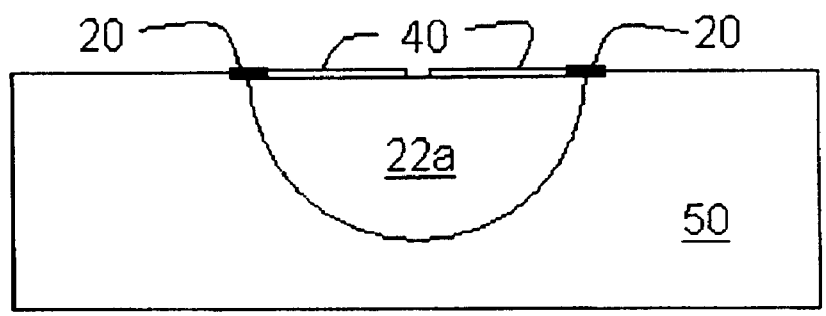
FIGS. 6A through 6C illustrate an exemplary process of manufacturing LED devices in accordance with aspects of the present invention.
Figure 6B:
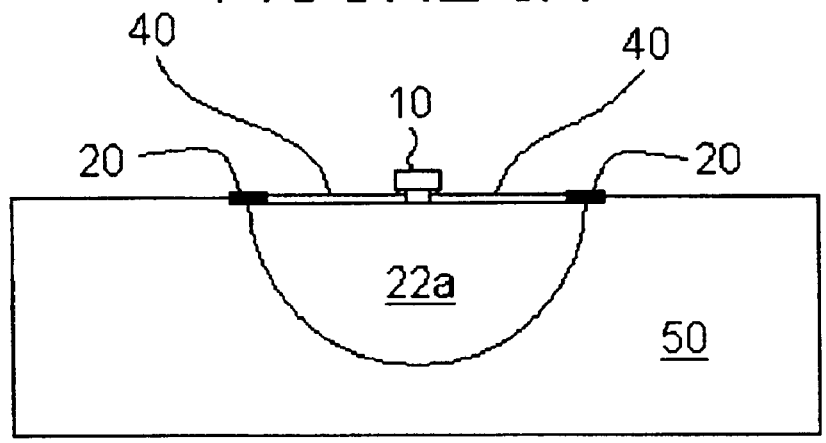
Figure 6C:
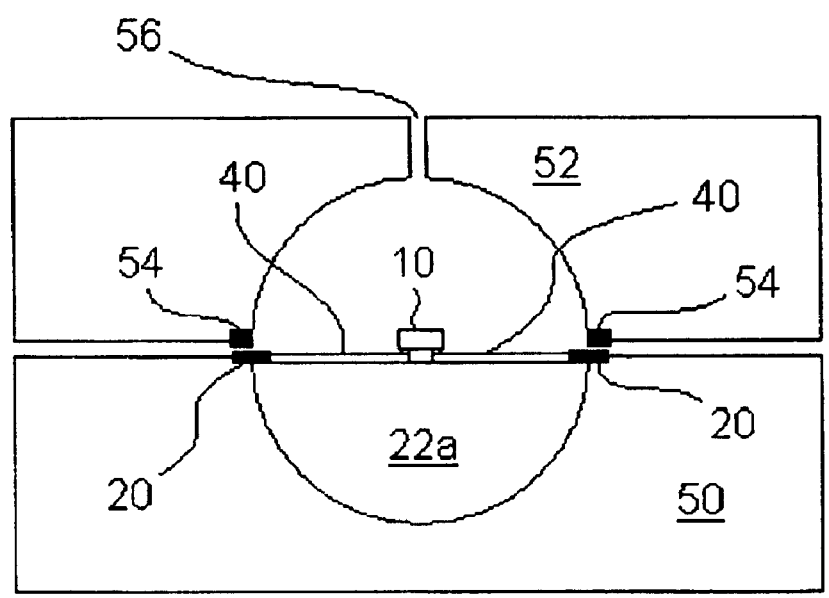

With reference to FIGS. 6A through 6C, an exemplary process for manufacturing the LED device A of FIG. 4 is shown. Common reference numbers again refer to like parts or elements. The first hemispherical mold 50 is filled with the encapsulant material 22a. The pads 20 are held by the mold 50 at the periphery of the hemisphere, or are otherwise placed there either before or after the encapsulant material 22a is deposited in the mold 50. After the encapsulant material 22a is deposited in the mold 50, the conductor 40 is deposited or otherwise arranged on top thereof as shown in FIG. 6A. A silk-screening, masking or other similar technique is preferably used to define the pattern the conductor 40 forms. The die 10 is then bonded to the conductor 40 with an electrically conductive adhesive 42 or the like, preferably, via a flip-chip bonding technique. See FIG. 6B. Thereafter, as shown in FIG. 6C, the second hemispherical mold 52 is positioned and secured over the first hemispherical mold 50 such that they define a substantially spherical cavity, albeit half filled with the encapsulant material 22a. Preferably, the rubber o-ring 54 is arranged between the molds 50 and 52 at least partially covering the pads 20 so as to promote a good seal between the molds 50 and 52 and protects the pads 20 from being completely molded over with the encapsulant material 22a. Additional encapsulant material 22a is injected through port 56 to fill the remainder of the cavity defined by the molds 50 and 52. Once the added encapsulant material 22a has cured, the resulting LED device A of FIG. 4 may be unmolded.

Figure 7A:
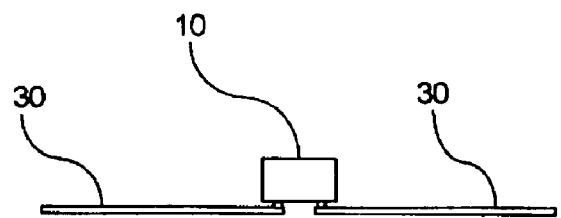
FIGS. 7A and 7B illustrate another exemplary process of manufacturing LED devices in accordance with aspects of the present invention.
Figure 7B:
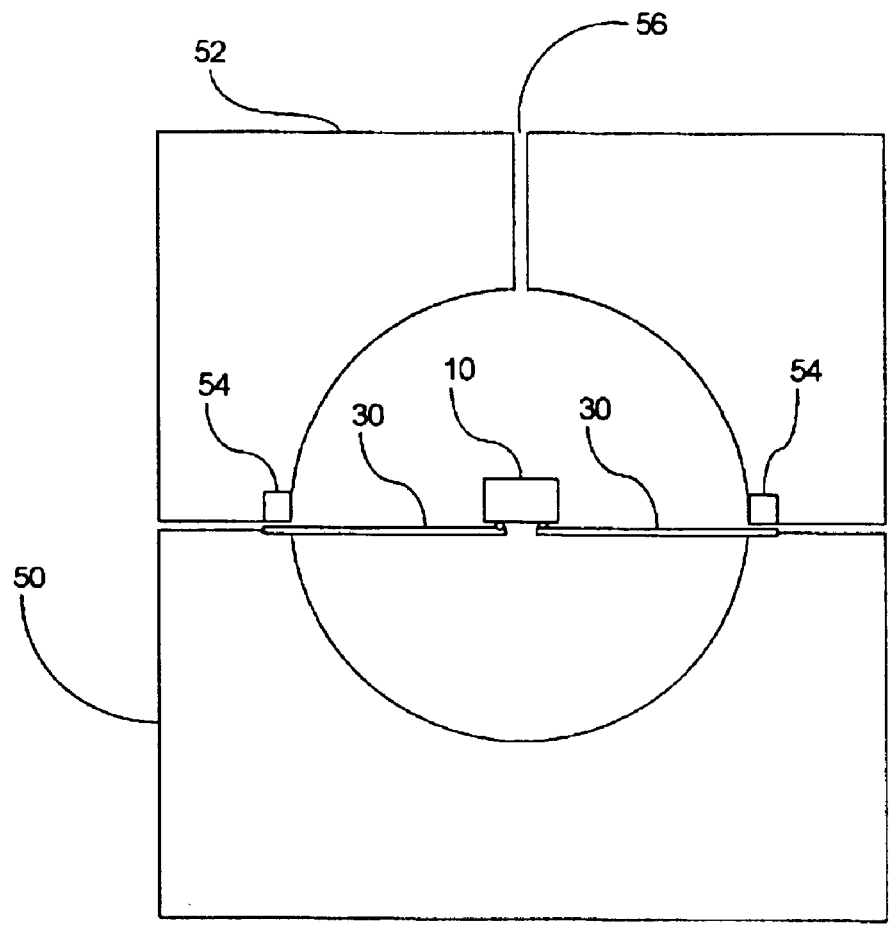

With reference to FIGS. 7A and 7B, an exemplary process for manufacturing the LED device A of FIG. 2 is shown. As before, common reference numbers again refer to like parts or elements. In this example, it is assumed that the pads 20 are an integral part of the lead-frame 30. Preferably, the die 10 is first flip-chip bonded to the lead-frame 30. See FIG. 7A. Thereafter, the molds 50 and 52 are positioned and clamped around the lead-frame 30 such that the die 10 is centered in the cavity and at least a portion of the lead-frame 30 remains outside the cavity to form the pads 20. Finally, the cavity is filled with the encapsulant material 22a through the port 56. See FIG. 7B. It is to be appreciated that, in this embodiment, the molding of the encapsulant 22 is a single injection process. Further, it is to be appreciated that the LED device A of FIG. 3 can be similarly manufactured. That is to say: the die 10 may first be bonded to the die-receiving area 32 of the first lead of the lead-frame 30, the wire bond 18 then attached between the die 10 and the second lead of the lead-frame 30, then the molds 50 and 52 positioned and clamped around the lead-frame 30 such that the die 10 is centered in the cavity and at least a portion of the lead-frame 30 remains outside the cavity, and the cavity then filled with the encapsulant material 22a through the port 56. In either case, once the encapsulant material 22a has cured, the LED device A may then have the molds 50 and 52 removed therefrom.

Figure 8A:
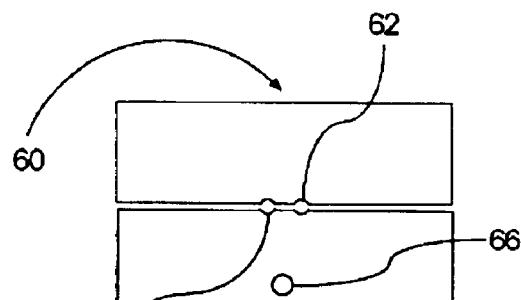
FIGS. 8A through 8C illustrate yet another exemplary process of manufacturing LED devices in accordance with aspects of the present invention.
Figure 8B:
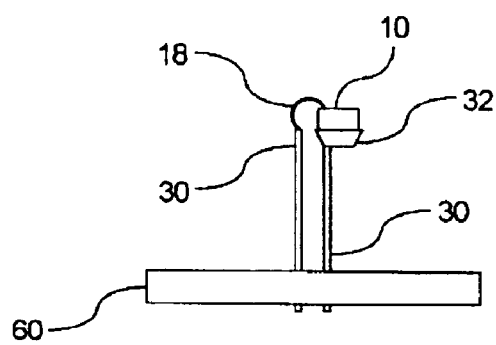
Figure 8C:
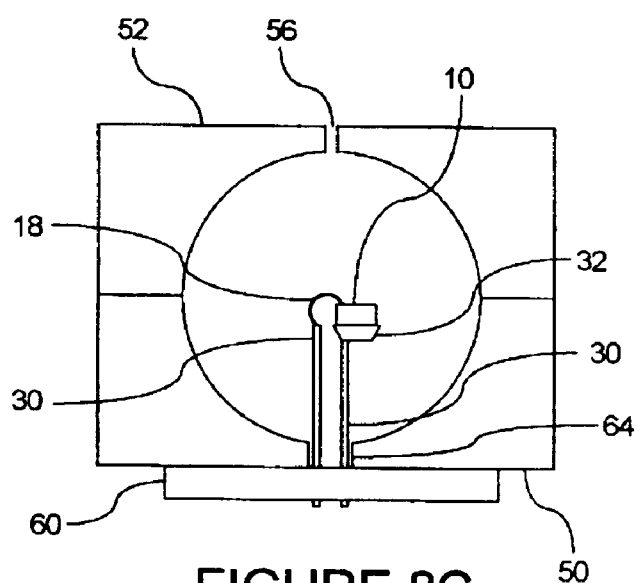

With reference to FIGS. 8A through 8C, an exemplary process for manufacturing the LED device A of FIG. 3 is shown. Again, common reference numbers refer to like parts or elements. The leads of the lead-frame 30 are held in and supported by a two part clamp 60. See FIG. 8A showing a top plan view of the clamp 60. Preferably, recessed gripping regions 62 in the clamp 60 are sized and/or otherwise arranged to receive and hold the leads of the lead-frame 30. As shown in the side view of FIG. 8B, while supported in the clap 60 the die 10 is bonded to the die-receiving area 32 of the first lead of the lead-frame 30, and the wire bond 18 is attached between the die 10 and the second lead of the lead-frame 30.

As shown in FIG. 8C, the clamped lead-frame 30, with the die 10 and wire bond 18 in place, is then positioned in the mold 50, 52 through an access channel 64. While shown in the mold half 50, it is to be appreciated that the channel 64 may also be in the mold half 52. Preferably, the die 10 is centered in the cavity defined by the mold 50, 52 and the lead-frame 30 extends out from the same. The cavity is then filled with the encapsulant material 22a through the port 56. In the case where the port 56 and channel 64 are in the same mold half, optionally a opening 66 is included in the clamp 60 which aligns with the port 56 when the lead-frame 30 is extended through the channel 64. Accordingly, the port 56 is not obstructed by the clamp 60 and can it still be accessed via the opening 66 for injection of the encapsulant material 22a into the cavity of the mold 50, 52. Similarly, another opening (not shown) may optionally be included in the clamp 60. The other opening is preferably arranged to align with a vent (not shown) in the mold 50, 52. In any event, once the encapsulant material 22a has cured, the mold 50, 52 and clamp 60 may be removed to reveal the LED device A of FIG. 3.

Preferably, the molds 50 and 52 are made of silicone, a rigid Teflon®, Teflon® coated aluminum, or other like mold from which the deposited encapsulant material 22a would readily release after curing. Moreover, it is to be appreciated that the manufacturing processes described herein are merely exemplary and are not intended to be limiting. Alternately, other known injection type molding processes or the like may be employed to manufacture the LED device A.

The invention has been described with reference to the preferred embodiment(s). Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A light emitting diode device comprising:
   a light emitting diode chip;
   an encapsulant surrounding the light emitting diode chip, said encapsulant being substantially spherical in shape; and,
   an electrically conductive path extending from the light emitting diode chip to a periphery of the encapsulant such that the light emitting diode chip is selectively energized to produce light by applying electricity to the electrically conductive path at the periphery of the encapsulant.

2. The device of claim 1, wherein the light emitting diode chip is substantially centered within the encapsulant.

3. The device of claim 1, wherein a diameter of the encapsulant is at least ten times as large as a largest dimension of the light emitting diode chip.

4. The device of claim 1, wherein a diameter of the encapsulant is at least twenty times as large as a largest dimension of the light emitting diode chip.

5. The device of claim 1, further comprising a phosphor, said phosphor being at least one of coated on the periphery of the encapsulant and dispersed within the encapsulant.

6. The device of claim 1, wherein an index of refraction of the encapsulant substantially matches an index of refraction of the light emitting diode chip.

7. The device of claim 1, wherein the light emitting diode chip includes a semiconductor material formed on an at least partially transparent substrate.

8. The device of claim 7, wherein an index of refraction of the encapsulant substantially matches the higher of an index of refraction of the semiconductor material and an index of refraction of the substrate.

9. The device of claim 1, wherein the electrically conductive path includes:
   electrically conductive pads arranged at the periphery of the encapsulant; and,
   electrically conductive wire bonds connected between the electrically conductive pads and electrodes on the light emitting diode chip.

10. The device of claim 1, wherein the electrically conductive path includes a lead-frame having solder bumps arranged thereon, said light emitting diode chip being flip-chip bonded to the lead-frame such that the solder bumps make electrical contact with electrodes on the light emitting diode chip.

11. The device of claim 1, wherein the electrically conductive path includes:
   a lead-frame having first and second leads, said first lead having a chip-receiving area to which the light emitting diode chip is bonded such that a first electrode of the light emitting diode chip is in electrical contact with the first lead; and,
   a wire bond connecting a second electrode of the light emitting diode chip to the second lead of the lead-frame.

12. The device of claim 1, wherein the electrically conductive path includes a substantially optically transparent electrically conductive material extending from the light emitting diode chip to a periphery of the encapsulant.

13. A method of manufacturing a light emitting diode device comprising:
   providing a light emitting diode chip;
   surrounding the light emitting diode chip with a substantially spherical encapsulant; and,
   providing an electrically conductive path extending from the light emitting diode chip to a periphery of the encapsulant such that the light emitting diode chip is selectively energized to produce light by applying electricity to the electrically conductive path at the periphery of the encapsulant.

14. The method of claim 13, further comprising:
   arranging the light emitting diode chip substantially at a center of the encapsulant.

15. The method of claim 13, further comprising:
   forming a first hemispherical portion of the encapsulant;
   placing the light emitting diode chip on the first hemispherical portion of the encapsulant; and,
   forming a second hemispherical portion of the encapsulant over the light emitting diode chip.

16. The method of claim 13, further comprising:
   forming a first hemispherical portion of the encapsulant;
   depositing a pattern of electrically conductive material on the first hemispherical portion of the encapsulant to form at least a portion of the electrically conductive path;
   placing the light emitting diode chip over the first hemispherical portion of the encapsulant; and,
   forming a second hemispherical portion of the encapsulant over the light emitting diode chip and electrically conductive material.

17. The method of claim 13, further comprising:
   bonding the light emitting diode chip to a lead-frame which makes up at least a portion of the electrically conductive path;
   arranging a mold having a substantially spherical cavity around the light emitting diode chip; and, injecting an encapsulant material into the mold to form the encapsulant.

18. The method of claim 17, wherein the mold is a two part mold with each part defining a substantially hemispherical recess such that together they define the substantially spherical cavity.

19. The method of claim 17, further comprising:

supporting the lead-frame in a clamp while bonding the light emitting diode chip thereto.

20. A method of producing light comprising:

providing a light emitting diode chip;

surrounding the light emitting diode chip with a substantially spherical encapsulant;

providing an electrically conductive path extending from the light emitting diode chip to a periphery of the encapsulant; and, applying electricity to the electrically conductive path at the periphery of the encapsulant such that the light emitting diode chip is energized to produce light.

21. The method of claim 20, further comprising:

observing the light produced to measure how much optical power is output; and, determining a k factor based upon the observation.

22. The method of claim 20, further comprising:

taking goniometric measurements of the light produced; and, modeling at least one characteristic of the light emitting diode base upon the measurements.

23. The method of claim 22, wherein the at least one characteristic includes view angle output of the light emitting diode.

* * * * *